US011842908B2

(12) United States Patent
Rajavelu Muralidhar et al.

(10) Patent No.: US 11,842,908 B2
(45) Date of Patent: Dec. 12, 2023

(54) SEMICONDUCTOR PROCESSING CHAMBER WITH FILAMENT LAMPS HAVING NONUNIFORM HEAT OUTPUT (71) Applicant: ASM IP HOLDING B.V., Almere (NL)

(72) Inventors: Shiva K. T. Rajavelu Muralidhar, Tempe, AZ (US); Sam Kim, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 153 days.

(21) Appl. No.: 17/152,241

(22) Filed: Jan. 19, 2021

(65) Prior Publication Data

US 2021/0225671 A1  Jul. 22, 2021

Related U.S. Application Data (60) Provisional application No. 62/963,843, filed on Jan. 21, 2020.

(51) Int. Cl.
*H01K 1/14* (2006.01)
*H01K 7/00* (2006.01)
(Continued)

(52) U.S. Cl.
CPC .... *H01L 21/67115* (2013.01); *F27B 17/0025* (2013.01); *H01K 1/14* (2013.01);
(Continued)

(58) Field of Classification Search
CPC ....... C30B 25/105; C30B 25/12; C23C 16/54; C23C 16/481; C23C 16/482;
(Continued)

(56) References Cited

U.S. PATENT DOCUMENTS 4,558,660 A * 12/1985 Nishizawa ............ C30B 25/105
257/E21.349
7,636,522 B2 * 12/2009 Nagarajan ............ H04B 10/506
398/79
(Continued)

FOREIGN PATENT DOCUMENTS

DE  10 2007 029 372      *  1/2009
EP     1 962 323 A1  *  8/2008  ........... H01L 21/324
(Continued)

*Primary Examiner* — Mary A Wilczewski
(74) *Attorney, Agent, or Firm* — Banner & Witcoff, Ltd.

(57) ABSTRACT

An arrangement of linear heat lamps is provided which allows for localized control of temperature nonuniformities in a substrate during semiconductor processing. A reactor includes a substrate holder positioned between a top array and a bottom array of linear heat lamps. At least one lamp of the arrays includes a filament having a varying density and power output along the length of the lamp. In particular, at least one lamp of the arrays includes a filament having a higher filament winding density within a central portion of the lamp relative to peripheral portions of the lamp. In some embodiments, the at least one lamp is a central lamp extending across a central portion of the substrate heated by the lamp. Furthermore, at least one lamp of the arrays has a higher power output within a central portion of the lamp than at peripheral portions of the lamp.

19 Claims, 8 Drawing Sheets (51) Int. Cl.
*H05B 3/44* (2006.01)
*F27B 17/00* (2006.01)
*H01L 21/324* (2006.01)
*H01L 21/67* (2006.01)
*H05B 3/00* (2006.01)
*F27D 5/00* (2006.01)

(52) U.S. Cl.
CPC ............ *H01K 7/00* (2013.01); *H01L 21/324* (2013.01); *H05B 3/0047* (2013.01); *F27D 5/0037* (2013.01)

(58) Field of Classification Search
CPC .............. C23C 16/4586; F27D 5/0037; F27B 17/0025; H01L 21/67109; H01L 21/67115; H01L 21/67207; H01L 21/324; H05B 3/0047; H01K 7/00; H01K 1/14
See application file for complete search history.

(56) References Cited

U.S. PATENT DOCUMENTS

| | | | |
|---|---|---|---|
| 11,562,915 B2* | 1/2023 | Hu | H01L 21/67207 |
| 2001/0010307 A1* | 8/2001 | Saito | C30B 31/12 |
| | | | 219/390 |
| 2002/0007797 A1* | 1/2002 | Stevens | C23C 16/481 |
| | | | 118/724 |
| 2003/0001475 A1* | 1/2003 | Halpin | H01K 1/24 |
| | | | 313/279 |
| 2008/0050104 A1* | 2/2008 | Mizukawa | H01K 9/08 |
| | | | 392/416 |
| 2008/0187347 A1* | 8/2008 | Song | G03G 15/2039 |
| | | | 399/88 |
| 2008/0298787 A1* | 12/2008 | Suzuki | H01K 1/16 |
| | | | 392/411 |
| 2009/0101633 A1* | 4/2009 | Aggarwal | F27B 17/0025 |
| | | | 219/385 |
| 2009/0243456 A1* | 10/2009 | Tanino | H01K 7/00 |
| | | | 313/1 |
| 2009/0243461 A1* | 10/2009 | Nakashima | H01K 7/00 |
| | | | 313/316 |
| 2010/0021147 A1* | 1/2010 | Nakashima | H01K 7/00 |
| | | | 392/407 |
| 2010/0054719 A1* | 3/2010 | Mizukawa | H01K 9/08 |
| | | | 313/578 |
| 2010/0072876 A1* | 3/2010 | Nakashima | H01K 1/16 |
| | | | 313/316 |
| 2010/0079052 A1* | 4/2010 | Tanino | H01K 1/40 |
| | | | 313/316 |
| 2010/0327784 A1* | 12/2010 | Taniguchi | H01K 1/60 |
| | | | 315/363 |
| 2016/0262207 A1* | 9/2016 | Abe | F27D 11/12 |
| 2017/0243770 A1* | 8/2017 | Abe | H05B 3/0047 |
| 2021/0225671 A1* | 7/2021 | Rajavelu Muralidhar | |
| | | | H01L 21/67115 |
| 2022/0301904 A1* | 9/2022 | Hu | H01L 21/67242 |

FOREIGN PATENT DOCUMENTS

| | | | | |
|---|---|---|---|---|
| EP | 1 998 358 | * | 12/2008 | |
| EP | 2 105 948 | * | 9/2009 | |
| EP | 2 159 824 | * | 3/2010 | |
| EP | 2 166 561 | * | 3/2010 | |
| JP | 2020-61296 | * | 4/2020 | |
| WO | WO 2019/208568 | * | 10/2019 | ............ H01L 21/26 |

* cited by examiner

SEMICONDUCTOR PROCESSING CHAMBER WITH FILAMENT LAMPS HAVING NONUNIFORM HEAT OUTPUT

CROSS-REFERENCE TO RELATED APPLICATIONS

The present application claims the benefit under 35 U.S.C. § 119(c) of U.S. Provisional Patent Application No. 62/963,843, filed Jan. 21, 2020, which is incorporated herein by reference in its entirety under 37 C.F.R. § 1.57. Any and all applications for which a foreign or domestic priority claim is identified in the Application Data Sheet as filed with the present application are hereby incorporated by reference under 37 C.F.R. § 1.57.

BACKGROUND

Field

The present disclosure generally relates to semiconductor processing equipment, including apparatuses for heating semiconductor substrates. More specifically, the embodiments herein relate to semiconductor processing equipment with heat lamps for providing nonuniform heat output to semiconductor substrates.

Description of the Related Art

In semiconductor processing, a variety of processes, including deposition, etching, and masking, involve heating of substrates. Chemical vapor deposition (CVD), for example, is a process for forming thin films of materials on substrates, such as silicon substrates. In a CVD process, gaseous molecules of the material to be deposited are supplied to substrates to form a thin film of that material on the substrates by chemical reaction. Such thin films may be polycrystalline, amorphous or epitaxial. Typically, CVD processes are conducted at elevated temperatures to accelerate the chemical reaction and to produce high quality films. Some processes, such as epitaxial silicon deposition, are conducted at extremely high temperatures (e.g., >450° C., <1220° C.).

During a CVD process, one or more substrates are placed on a substrate support inside a semiconductor processing reaction chamber. For example, the substrate can be a substrate and the substrate support can be a susceptor. Both the substrate and often the support are heated to a desired temperature. In a typical substrate treatment step, reactant gases are passed over the heated substrate, causing chemical vapor deposition (CVD) of a thin layer of the desired material on the substrate. If the deposited layer has the same crystallographic structure as the underlying silicon substrate, it is called an epitaxial layer. This is also sometimes called a monocrystalline layer because it has only one crystal structure. Through subsequent processes, these layers are made into integrated circuits, producing from tens to millions of integrated devices, depending on the size of the substrate and the complexity of the circuits.

When forming semiconductor devices, it is important that material be deposited uniformly thick and with uniform properties over the substrate. For instance, in Very Large and Ultra Large Scale Integrated Circuit (VLSI and ULSI) technologies, the substrate is divided into individual chips having integrated circuits thereon. If a CVD process step produces deposited layers with nonuniformities, devices at different areas on the substrate or on individual chips, or chips formed in different areas of the substrate, may have inconsistent operation characteristics, or may fail altogether.

In order to deposit uniform layers, complex systems for heating semiconductor substrates have been utilized, with the goal of providing a uniform temperature across a substrate. Without being limited by theory, it is believed that the uniform temperature provides uniform deposition results across the substrate. On the other hand, non-uniformity or instability of temperature across a substrate during other thermal treatments are believed to adversely affect the uniformity of resulting structures. Other processes for which temperature control also can be critical include oxidation, nitridation, dopant diffusion, sputter depositions, photolithography, dry etching, plasma processes, and high temperature anneals, among others.

Substrates can be heated using resistance heating, induction heating or radiant heating. Among these, radiant heating is the most efficient technique and is therefore a favored method for certain types of CVD. Radiant heating involves positioning infrared lamps within high-temperature ovens, called reactors (or reaction chambers) within which substrates are processed. Unfortunately, radiant energy has a tendency to create nonuniform temperature distributions, including "hot spots," due to the use of localized sources and the related focusing and interference effects.

To mitigate these effects, the infrared lamps within the reactor are positioned to facilitate controlling the temperature gradients in various locations within the reaction chamber. For instance, in some configurations, the infrared lamps are linear in design and are arranged in a pair of crossing arrays. The grid resulting from the crossing array configuration facilitates control over the temperature uniformity of the substrate by adjusting the power that is delivered to any particular lamp or group of lamps; however, due to the high temperatures and the high degree of temperature homogeneity typically desired, it can be difficult to properly configure the lamp arrays to provide such uniformity.

In an effort to provide even more uniform temperature distribution across substrates, reflectors have been mounted behind the lamps to indirectly illuminate the substrates. The reflectors, or light dams, shield a portion of lamps in localized areas of concern to result in a more balanced temperature profile throughout the chamber. These reflectors generally are made of a base metal and often are metal-plated to increase their reflectivity. Planar reflecting surfaces, however, still tend to induce hot spots on substrates being heated. In addition, while the reflectors can improve the temperature profile, integrating the reflectors into a production facility has been difficult from an assembly point of view and from an energy efficiency point of view. Once configured, modifying the reflectors to provide a different temperature profile can be challenging and time-consuming due to the various production and design parameters to be addressed.

Accordingly, a continuing need exists for simple systems for achieving uniform temperatures across semiconductor substrates during processing.

SUMMARY

Some aspects herein relate to a semiconductor processing system comprising: a reaction chamber comprising: a substrate holder configured to support a semiconductor substrate; and a top array of linear heat lamps, wherein at least one lamp of the top array of linear heat lamps configured to provide a power output, the power output varying across a length of the at least one lamp, and wherein the power output is higher within a central portion relative to the power output within peripheral portions of the at least one lamp. In some embodiments, the semiconductor processing system comprises a bottom array of linear heat lamps underlying the substrate holder. In some embodiments, a length of the central portion is 30 mm. In some embodiments, a ratio of the power output of the central portion to the power output of the peripheral portions is between 5 and 200. In some embodiments, wherein the power output of the central portion is 2000 W. In some embodiments, each lamp of the top array of linear heat lamps extends substantially parallel to every other lamp of the top array of heat lamps. In some embodiments, at least one lamp of the top array of linear heat lamp comprises a center lamp of the top array. In some embodiments, the top array of linear heat lamps comprises eleven lamps. In some embodiments, the at least one lamp is the sixth lamp from an edge of the top array. In some embodiments, wherein the reaction chamber further comprises a parabolic reflector.

Some aspects herein relate to a semiconductor processing system comprising: a reaction chamber comprising: a substrate holder configured to support a semiconductor substrate; and a top array of linear heat lamps, wherein at least one lamp of the top array of linear heat lamps comprises a filament having a varying density across a length of the at least one lamp, and wherein the density is higher within a central portion relative to the density within peripheral portions of the at least one lamp. In some embodiments, the filament of the at least one lamp comprises a wound portion in the central portion and a substantially linear portion in the peripheral portions. In some embodiments, the semiconductor processing system comprises a bottom array of linear heat lamps, wherein the substrate holder is located between the bottom array of linear heat lamps and the top array of linear heat lamps. In some embodiments, a length of the central portion is between 15 mm and 30 mm. In some embodiments, a ratio of the density of the filament in the central portion to the density of the filament in the peripheral portions is between 5 and 200. In some embodiments, each lamp of the top array of linear heat lamps extends substantially parallel to every other lamp of the top array of heat lamps. In some embodiments, the at least one lamp of the top array of linear heat lamp comprises a center lamp of the top array. In some embodiments, the top array of linear heat lamps comprises eleven lamps. In some embodiments, the at least one lamp is the sixth lamp from an edge of the top array.

Some aspects herein relate to a method of heating a semiconductor substrate, the method comprising: placing the substrate on a substrate holder, the substrate holder configured to support the semiconductor substrate; and heating the substrate with a top array of linear heat lamps, the top array of linear heat lamps overlying the semiconductor substrate, wherein at least one lamp of the top array of linear heat lamps comprises a filament having a varying winding density across a length of the at least one lamp, and wherein the winding density is higher within a central portion relative to the density within peripheral portions of the at least one lamp. In some embodiments, the method comprises heating the substrate with a bottom array of linear heat lamps while heating the substrate with the top array of linear heat lamps, and wherein the substrate holder is located between the bottom array of linear heat lamps and the top array of linear heat lamps. In some embodiments, a ratio of the winding density of the central portion to the winding density of the peripheral portions is between 5 and 200. In some embodiments, a length of the central portion is 30 mm. In some embodiments, each lamp of the top array of linear heat lamps extends substantially parallel to every other lamp of the top array of heat lamps. In some embodiments, the at least one lamp of the top array of linear heat lamp comprises a center lamp of the top array. In some embodiments, the top array of linear heat lamps comprises eleven lamps.

Some aspects relate to a method of heating a semiconductor substrate, the method comprising: placing the substrate on a substrate holder, the substrate holder configured to support the semiconductor substrate; heating the substrate with a top array of linear heat lamps, the top array of linear heat lamps overlying the semiconductor substrate, wherein at least one lamp of the top array of linear heat lamps comprises a power output, the power output varying across a length of the at least one lamp, and wherein the power output is higher within a central portion relative to the power output within peripheral portions of the at least one lamp. In some embodiments, the method comprises heating the substrate with a bottom array of linear heat lamps while heating the substrate with the top array of linear heat lamps, and wherein the substrate holder is located between the bottom array of linear heat lamps and the top array of linear heat lamps. In some embodiments, a ratio of the power output of the central portion to the power output of the peripheral portions is between 5 and 200. In some embodiments, a length of the central portion is 30 mm. In some embodiments, the power output of the central portion is 2000 W. In some embodiments, each lamp of the top array of linear heat lamps extends substantially parallel to every other lamp of the top array of heat lamps. In some embodiments, the at least one lamp of the top array of linear heat lamp comprises a center lamp of the top array. In some embodiments, the top array of linear heat lamps comprises eleven lamps.

DETAILED DESCRIPTION

Reactors used in semiconductor processing, including CVD reactors, typically employ radiant heat lamps positioned around a reaction chamber to achieve the desired high temperatures in the substrate. Unfortunately, as discussed herein, radiant energy has a tendency to create nonuniform temperature distributions, including "hot spots" and "cold spots" due to the use of localized radiant energy sources. The increased surface area of the substrate and the substrate holder near their outer edges also leads to convective heat loss, resulting in further temperature nonuniformities. Still other temperature nonuniformities can result from heat loss to the spider supporting the substrate, or from heat loss caused by the use of sweep gas underneath the substrate. Advantageously, some embodiments herein may address temperature nonuniformities resulting from a "cold spot" in a central portion of a semiconductor substrate. Temperature nonuniformities result in undesirable processing nonuniformities in the substrate, such as variations in thickness of deposited films and variations in electrical properties of deposited layers across the substrate.

Many systems have been proposed to provide uniform heating to a substrate. For example, to promote uniform temperature of the substrate during processing, some reactors include lamps that are grouped in separately controllable heating zones, allowing differing levels of power to be supplied to each individual zone. In some cases, different lamps extending partially or entirely across a substrate may be separately controlled to provide different amounts of heat energy to the substrate. Undesirably, such systems may be excessively complex and/or may not provide the desired control over substrate heating.

Some embodiments disclosed herein include a lamp having a central portion configured to provide high levels of heat energy to a substrate, and also having peripheral portions, on either side of the central portion, which provide low levels of heat energy to the substrate. Preferably, the lamp extends across an entire width of a substrate to be heated with the lamp. In some embodiments, the central portion has a radius of about 5.0 mm to about 30.0 mm, including about 7.5 mm to about 15.0 mm, and may provide a heat output of about 1000 W to about 2000 W. In some embodiments, the power output density in the central portion 242 may be about 60 W/mm to about 125 W/mm, while the power output in the peripheral portions is about 0 W/mm to about 10 W/mm. In some embodiments, the higher heat output in the central portion is provided by a higher filament winding density in the central portion relative to the peripheral portions. For example, the central portion may have a wound filament, while the peripheral portions have an un-wound, linear filament. In some other embodiments, the filament in both the central and peripheral portions are wound, and the central portion has a higher winding density than the peripheral portions.

Advantageously, by providing lamps with higher heat output in the central portion, a simple mechanism is provided to address cold spots in the central portion without requiring significant reengineering of a reaction chamber. Rather, the desired amount of increased heat output and the size of the central portion may be tailored to the expected size of a central cold spot in a substrate to be heated by the lamp. Moreover, this tailoring can be achieved in a reaction chamber in a simple retrofit by exchanging lamps. This can avoid, for example, the need to reengineer ancillary features such as reflectors for radiant heat, which may be difficult and time-consuming to reconfigure.

Reference will now be made to the figures, in which like numerals refer to like parts throughout.

Figure 1A:
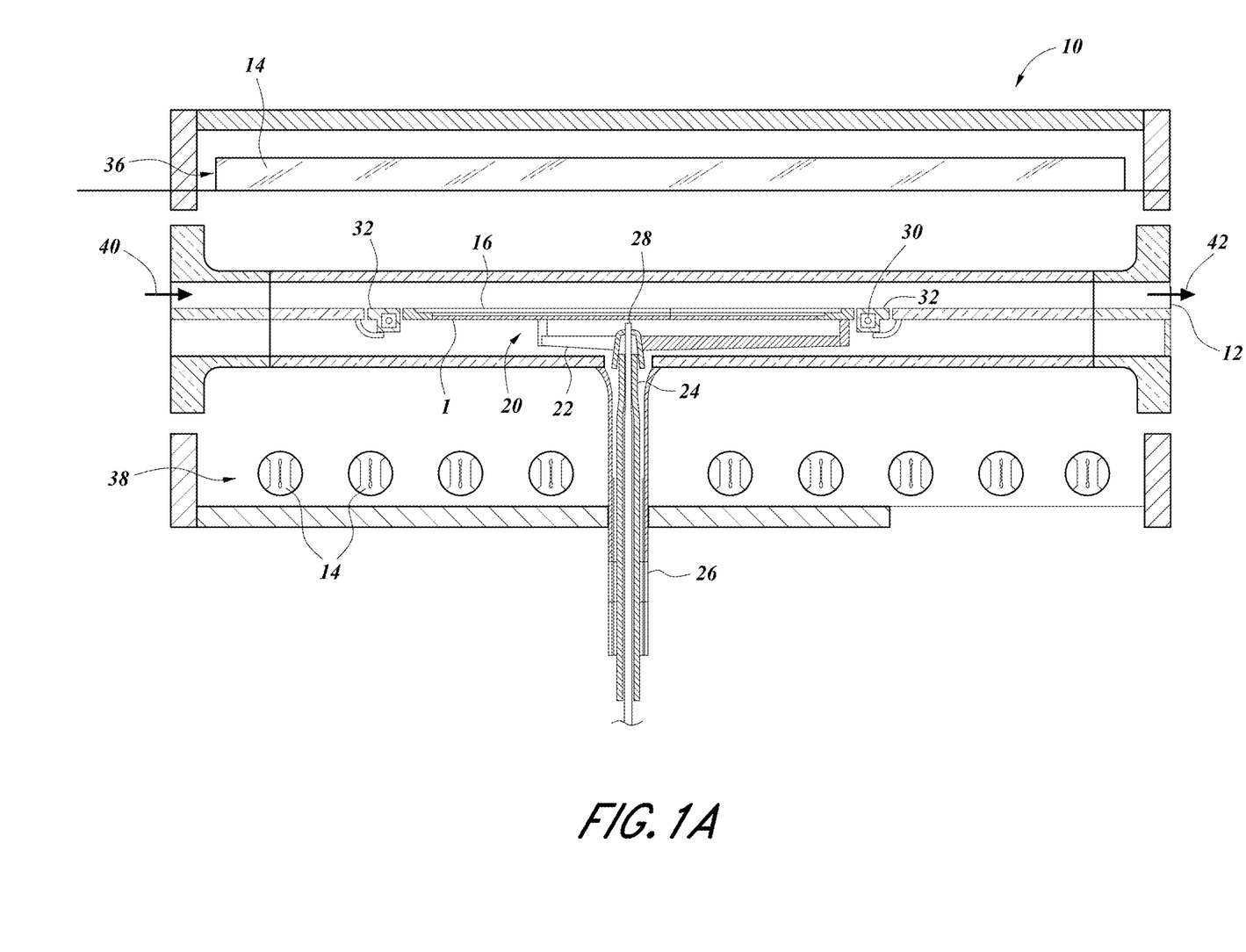
FIG. 1A is a cross-sectional view of a conventional reaction chamber along with a top array and a bottom array of heat lamps, the chamber having a substrate supported on a substrate holder therein.

FIGS. 1A-1D show a reactor 10 which may be used for CVD processing, and in which some the present embodiments may be practiced. As can be seen in FIG. 1A, the reactor 10 includes a reaction chamber 12 of a horizontal flow type formed of a material transparent to heat energy, such as quartz. Gas flows into and out of the chamber 12 with a generally horizontal flow in the direction indicated by arrows 40 (inlet) and 42 (outlet).

The reactor 10 is shown with an arrangement of heating lamps 14, disposed in a top array 36 above and a bottom array 38 below the chamber 12. Alternatively, only one such bank may be provided, e.g., the reactor 10 may include only the top array 36. Arrays 36 and 38 are supported outside the chamber 12 to provide heat energy to the chamber 12 through the chamber walls, preferably without appreciable absorption by the chamber walls. The reactor 10 includes a substrate support structure 20 comprising a substrate holder 1, upon which a semiconductor substrate 16 may rest. A spider 22 may be provided to support the holder 1. The spider 22 may be made of a transparent material. The material may also be non-metallic to reduce the risk of contamination. The spider 22 may be mounted to a shaft 24, which extends downwardly through a tube 26 descending from the lower wall of the chamber 12. During substrate processing, the shaft 24, spider 22, and holder 1 are configured to be rotated in unison about a vertical center axis of the holder 1.

While this disclosure is not limited to any particular theory, in some configurations of the reactor 10, undesirable temperature nonuniformity is believed to result from radiation heat loss from the substrate holder 1 and/or support structure 20 to the spider 22 and/or the shaft 24, which may comprise quartz. While quartz has a relatively low coefficient of thermal conductivity and while many of the parts of the reactor are also formed of quartz and even when underlying spot lamps are utilized to provide heat to central areas of a substrate, it is believed that there is nevertheless a significant differential in heat loss through the support structure 20 to the spider 22 and/or the shaft 24 due to the high processing temperatures employed during very high temperature depositions. For example, in some embodiments, the processing temperatures for such very high temperature depositions may range from around 1000° C. to 1200° C. In some embodiments, the width of the central portion of the lamp filaments having higher winding density, as disclosed herein, may roughly correspond to the width of the spider 22.

Figure 1B:
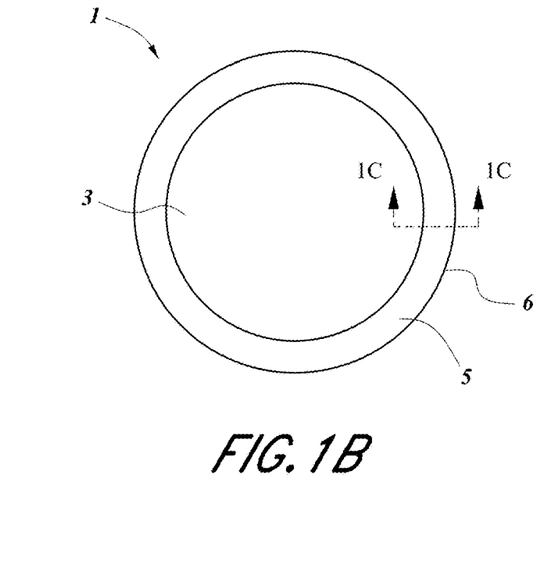
FIG. 1B is a top plan view of a conventional substrate holder.
Figure 1C:
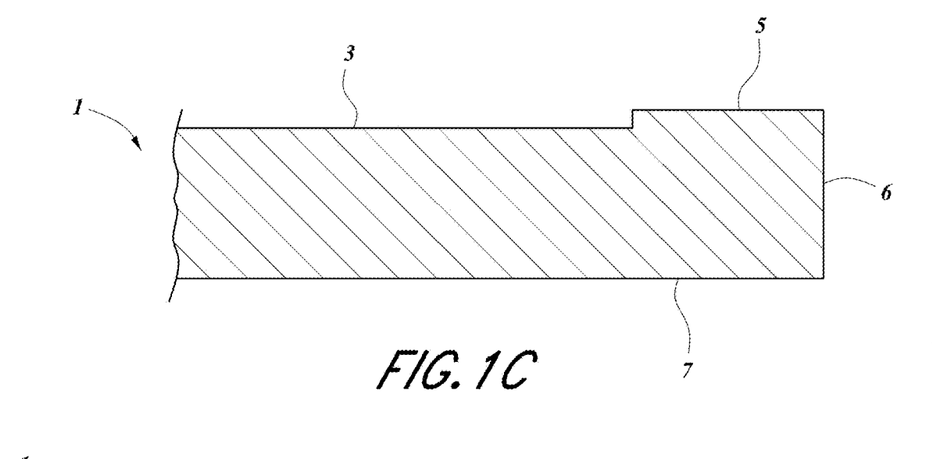
FIG. 1C is a partial cross-sectional view of the substrate holder of FIG. 1B, taken along line 1C-1C of FIG. 1B.
Figure 1D:
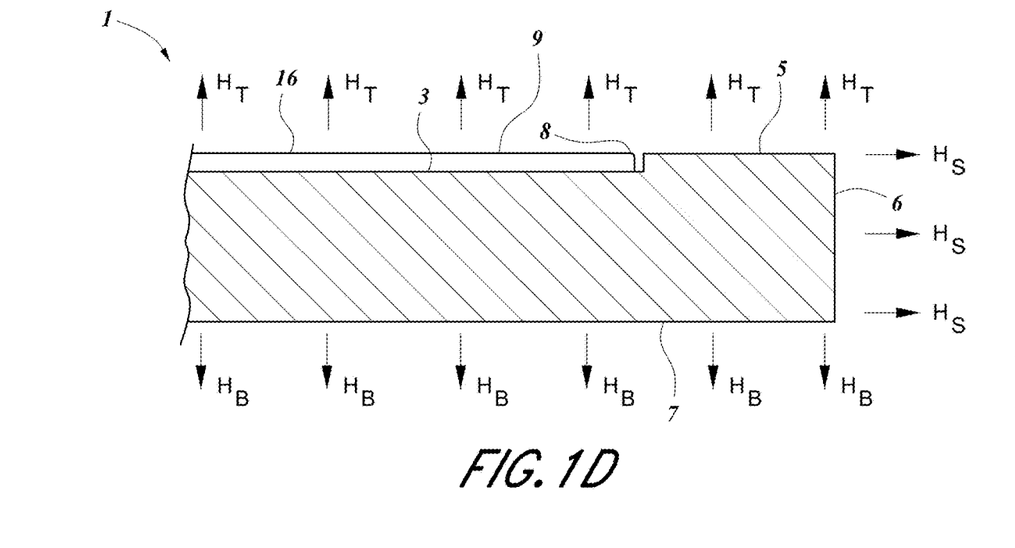
FIG. 1D is a partial cross-sectional view of the substrate holder of FIGS. 1B and 1C, shown with a substrate held thereon.

FIGS. 1B-1D further illustrate examples of the substrate holder 1 of the reactor 10. The holder 1 may have a generally circular shape and include a pocket 3 configured to receive the substrate 16. During substrate processing, the substrate holder 1 may absorb heat from the radiant heat lamps 14 (FIG. 1A) surrounding the reaction chamber 12. The substrate holder 1 may also lose heat to the surrounding environment (e.g., to the chamber walls, which typically are not perfectly reflective). Some of this heat may be re-radiated from the holder 1, while the rest may be lost by convection and conduction. With reference to FIG. 1D, the holder 1 loses heat from its upper surfaces 3 and 5, side surface 6, and bottom surface 7, and the substrate 16 loses heat from its upper surface 9 and its edge 8. The arrows HT schematically illustrate the heat lost at the upper surfaces 3, 5, and 9. Similarly, the arrows HS and HB schematically illustrate the heat loss at the side surface 6 and the bottom surface 7, respectively. Throughout most of the holder/substrate combination, the heat loss HT and HB is typically counterbalanced with uniform heat input from the lamps 14 across the combination surface. However, there is additional heat loss HS at the outer radial edge of the holder/substrate combination, which receives less direct radiation. Furthermore, localized temperature nonuniformities may also result from conductive heat loss to the spider 22 or from convective heat loss from the introduction of sweep gas through holes in the substrate holder 1 underneath the substrate 16.

Without localized control of power output to the heat lamps 14, these temperature nonuniformities may be either undercompensated or overcompensated. Consequently, lamps may cause some degree of processing nonuniformities in the processed substrate, which can render some portions of the substrate unusable. For example, the area near the outer radial edge 8 of the substrate 16 is commonly referred to as an ""exclusion zone,"" because this area cannot be used to fabricate satisfactory chips.

Referring once again to FIG. 1A, the exemplary reactor 10 includes a central temperature sensor or thermocouple 28 extending through the shaft 24 and the spider 22 in proximity to the substrate holder 1. Additional peripheral thermocouples 30 may also be housed within a slip ring or temperature compensation ring 32, which may surround the substrate holder 1 and the substrate 16. The thermocouples 28, 30 may be connected to a temperature controller (not shown), which may selectively set the power of the various heating elements 14 in response to the readings of the thermocouples 28, 30.

Various heating schemes using lamps have been proposed to provide a uniform temperature across a substrate. Some of these heating schemes will now be further discussed.

Figure 2A:
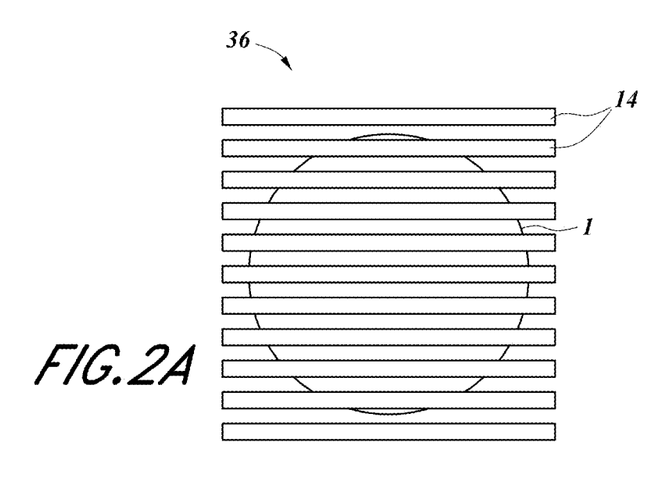
FIGS. 2A and 2B are schematic top (2A) and bottom (2B) plan views showing a conventional arrangement of lamps in a top array (2A) and a bottom array (2B) of a reactor.
Figure 2B:
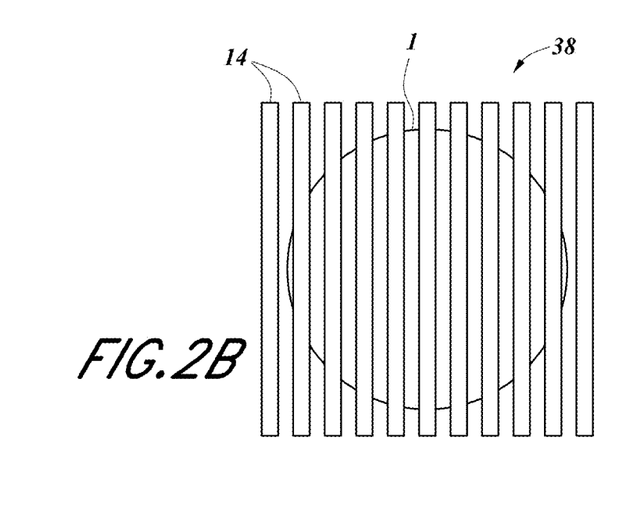

With reference now to FIGS. 2A and 2B, an example of an arrangement of heating lamps 14 is further illustrated. The arrangement includes long lamps 14 which span at least the diameter of the substrate holder 1. As shown in the figures, the lamps 14 in the top array 36 may be arranged parallel to each other and perpendicular to the lamps 14 in the bottom array 38. While FIG. 1A shows the top array 36 having lamps 14 oriented parallel to the direction of gas flowing through the chamber 12, and the bottom array 38 having lamps 14 oriented perpendicular to the direction of gas flow, it is will be understood that these orientations can be reversed. That is, the top array 36 can be perpendicular to the direction of gas flowing through the chamber 12, and the bottom array 38 can be parallel to the direction of gas flowing through the chamber 12. Alternatively, both banks 36, 38 can be oriented in the same direction in some embodiments. Also, the lamps 14 need not be arranged collinearly; instead, they may be laterally or vertically offset from one another. Additionally, the lamps need not be arranged parallel to one another; rather, they may be disposed askew to one another, depending on the requirements of the particular application.

Although the lamps 14 are disposed in a uniform pattern, temperature nonuniformities may still occur in the substrate. Undesirably, an arrangement of long lamps 14 may make localized control of temperature difficult, because power to an entire lamp 14 must be adjusted in order to address a local nonuniformity.

Figure 3A:
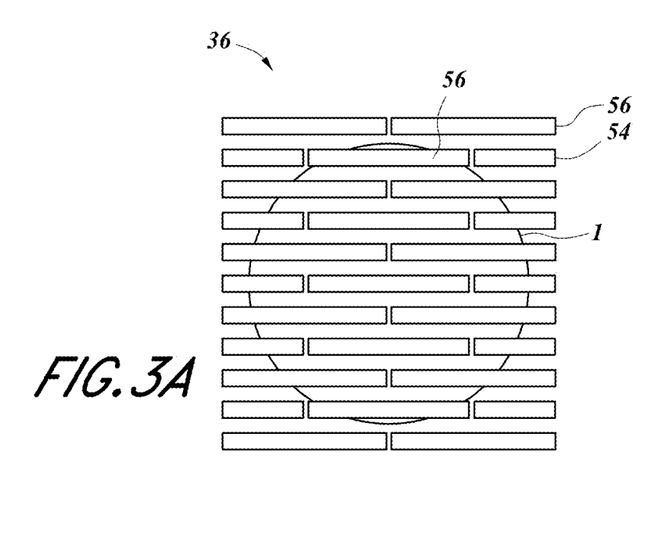
FIGS. 3A and 3B are schematic top (3A) and bottom (3B) plan views showing an alternative arrangement of lamps in a top array (3A) and a bottom array (3B) of a reactor.
Figure 3B:
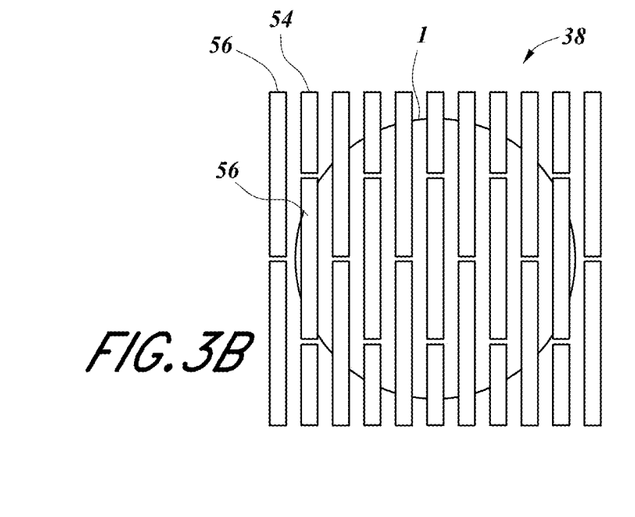

Referring now to FIGS. 3A and 3B, an alternative proposed arrangement of lamps is illustrated. The top array 36 and bottom array 38 may include linear heat lamps 54, 56 which are each shorter than the diameter of the substantially circular substrate holder 1. The lamps 54, 56 may also be shorter than the diameter of the pocket 3. The lamps 56 may, for example, be approximately half the diameter of the substrate holder 1; the lamps 54 may be approximately half the length of the lamps 56. As illustrated in the figure, the lamps 54, 56 in each array 36, 38 may be arranged in a repeating pattern of substantially parallel rows. The lamps 54, 56 of the top array 36 may be positioned so as to be substantially perpendicular to the lamps 54, 56 of the bottom array 38. The lamps 54, 56 in the top array 36 may be suspended from, or attached to, a ceiling plate or framework (not shown) mounted in the reactor 10. Similarly, the lamps 54, 56 in the bottom array may be attached to a floorplate or framework (not shown) mounted in the reactor 10. Providing more, shorter lamps may allow for control of incident power over smaller portions of a substrate, allowing temperature adjustment over a smaller area without affecting temperature over an adjoining area. However, shorter lamps may introduce additional installation, manufacturing, and control complexities such that a simpler arrangement of heat lamps may be desired in certain embodiments.

Figure 4:
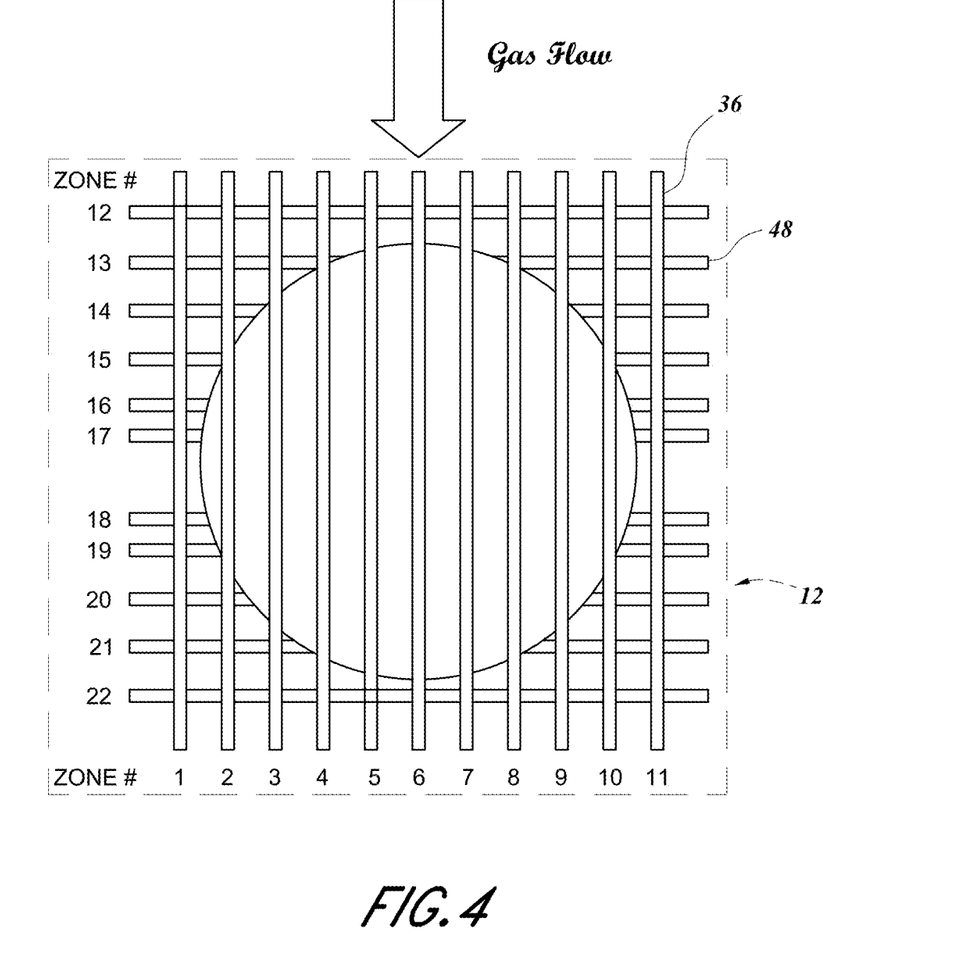
FIG. 4 is a schematic top plan view of a portion of a processing system environment, illustrating an array of radiant heat lamps disposed above and below an exemplary substrate.

With reference now to FIG. 4, a grid of heat lamps, which is fashioned from a top array of lamps 36 and a bottom array of lamps 38, is illustrated therein. In the illustrated arrangement, a substrate is disposed within a reaction chamber 12 in a position generally between the top array of lamps 36 and the bottom array of lamps 38. It should be noted that, in some chambers, the top array and the bottom array can be constructed differently. For instance, the bottom array 38 can generally accommodate spot lamps, a rotating shaft 24 and a gas supply tube. Thus, the central region of the bottom array may not admit to full linear lamps passing from one side to the other. To the contrary, in such a configuration, the top array would not have such obstructions and full linear lamps passing from one side to the other can be easily accommodated and implemented. It will be appreciated that the fewer or more lamps may be utilized and/or other heating devices may be used to augment the heat provided by the lamps. For example, in some embodiments, the bottom array of lamps 38 may comprise an additional linear lamp forming a heating zone 23 (not shown) and/or one or more spot lamps forming a heating zone 24 (not shown) to direct heat to central portions of the substrate from the underside of the substrate.

With continued reference to FIG. 4, in one arrangement of the grid, the lamps are linear and eleven lamps make up each of the top array and the bottom array. It should be noted that other numbers of lamps also can be used. The lamps 36 of the top array preferably extend generally perpendicular to the lamps 38 of the bottom array. Generally, the lamps 36, 38 may receive differing power levels to account for end effects and other phenomena that may vary the temperature gradient across the substrate. The differing power levels result in a number of zones. In the illustrated arrangement, six zones are provided in the top array (i.e., zones 1-11) and nine zones are provided in the bottom array (i.e., zones 12-22). In some embodiments, an additional lamp is added to the lamps of the bottom array 38 to provide a zone 23. These zones may receive differing levels of power such that the temperature gradient across the substrate can be substantially uniform across all portions of the substrate surface. The lamps 36, 38 can be individually controlled or controlled in the illustrated groups or zones. Each zone may be associated with a temperature control module based on feedback from temperature sensors (e.g., the thermocouples 28, 30 of FIG. 1A).

Figure 5A:
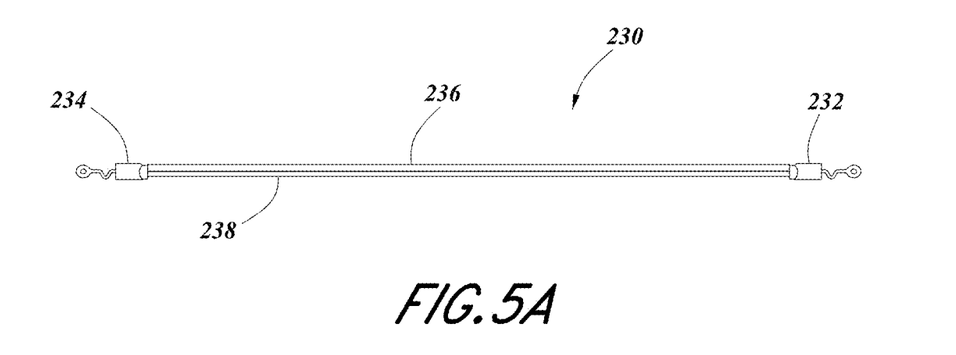
FIG. 5A is a top plan view of a single linear radiant heat lamp.
Figure 5B:
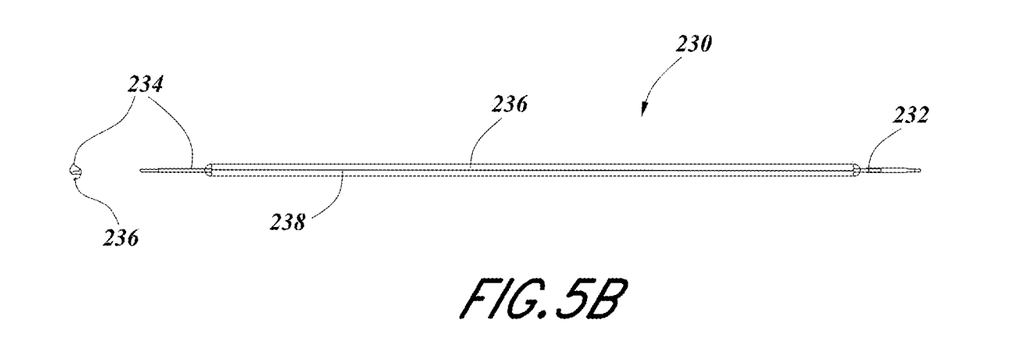
FIG. 5B is a side view of the linear lamp of FIG. 5A.

With reference now to FIGS. 5A-5B, a lamp 230 is illustrated. The illustrated lamp 230 generally comprises two connectors 232, 234 disposed at opposite ends of a tube 236. A filament 238, shown schematically in FIGS. 5A-5B, extends through the tube 236 and is electrically connected to each of the end connectors 232, 234. Thus, when a power source is connected across end connectors 232, 234, the filament 238 receives current and emits heat energy.

The lamps 230 can have varied dimensions depending upon the application and size desired. For example, the lamps may comprise a length extending between connectors 232, 234 at opposite ends of tube 236. In some embodiments, the length of the lamps may be about 420 mm. In some embodiments, the length of the lamps may be about 100 mm to about 1200 mm. For example, in some embodiments, the length of the lamps may be about 100 mm, about 120 mm, about 140 mm, about 160 mm, about 180 mm, about 200 mm, about 220 mm, about 240 mm, about 260 mm, about 280 mm, about 300 mm, about 320 mm, about 340 mm, about 360 mm, about 380 mm, about 400 mm, about 420 mm, about 440 mm, about 460 mm, about 480 mm, about 500 mm, about 520 mm, about 540 mm, about 560 mm, about 580 mm, about 600 mm, about 620 mm, about 640 mm, about 660 mm, about 680 mm, about 700 mm, about 720 mm, about 740 mm, about 760 mm, about 780 mm, about 800 mm, about 820 mm, about 840 mm, about 860 mm, about 880 mm, about 900 mm, about 920 mm, about 940 mm, about 960 mm, about 980 mm, about 1000 mm, about 1020 mm, about 1040 mm, about 1060 mm, about 1080 mm, about 1100 mm, about 1120 mm, about 1140 mm, about 1160 mm, about 1180 mm, about 1200 mm, or between any of the aforementioned values.

Figure 6:
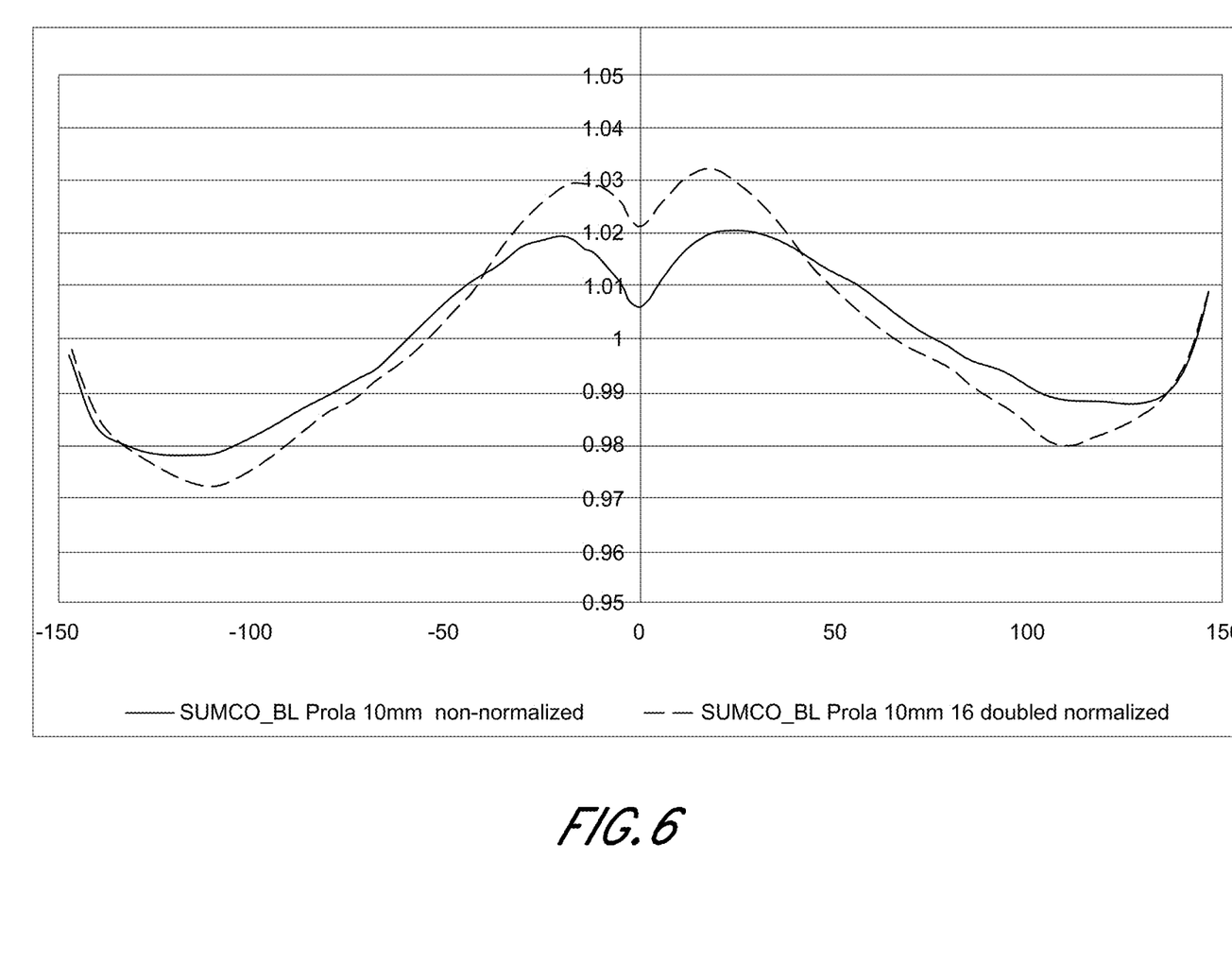
FIG. 6 illustrates a deposited thickness curve, comparing the thickness of deposited films across the surface of the substrate relative to the center.

Even with the advances of localized temperature control mechanisms, spot lamps, and/or rotating susceptor technology, issues may remain with achieving uniform heat distribution across the surface of the substrate. For example, in some cases, a central portion of the top surface of the substrate may have a dip in the temperature profile across the substrate. Undesirably, the zone-based heating schemes have been insufficient to address this temperature dip. Referring to FIG. 6, even using zone heating, the deposited thickness across the surface of the substrate has been found to dip at the center of the substrate (i.e., at 0 along the x-axis of the curve). For example, the dip may occur when depositing silicon (e.g., epitaxial silicon).

Advantageously, lamp constructions according to some embodiments may mitigate or eliminate this dip in the thickness profile at the center of the substrate. While reflector modifications may be used in some instances to direct and focus heat energy on the center of the substrate to increase the temperature at that center, these changes require significant changes in design of the reactor and lamps and may be undesirably time-consuming to implement. Some embodiments described herein, however, may mitigate or eliminate the temperature dip at the center of the substrate with simply minor modifications to substrate heating systems, enabling a more uniform deposition thickness across the substrate. For example, the embodiments described herein may be implemented without altering the arrangement of the linear lamp array or the envelope and form factor of lamps generally used in the reactor. In some embodiments, the lamp constructions according to some embodiments may reduce the central temperature dip, enhancing temperature uniformity in a semiconductor processing system.

In some embodiments, the lamp constructions according to some embodiments may reduce, mitigate, or eliminate a dip or reduction in the temperature profile at a central portion on the surface of a substrate. In some embodiments, the central portion may comprise a substantially circular portion of the surface located concentrically with the substrate. In some embodiments, the substantially circular portion may comprise a radius of about 7.5 mm to about 15.0 mm. In some embodiments, the substantially circular portion may comprise a radius of about 5.0 mm to about 30.0 mm. In some embodiments, the substantially circular portion may comprise a radius of about 5 mm, about 7.5 mm, about 10 mm, about 12.5 mm, about 15 mm, about 17.5 mm, about 20 mm, about 22.5 mm, about 25 mm, about 27.5 mm, about 30 mm, about 32.5 mm, about 35 mm, about 37.5 mm, about 40 mm, about 42.5 mm, about 45 mm, about 47.5 mm, about 50 mm, or between any of the aforementioned values.

Figure 7A:
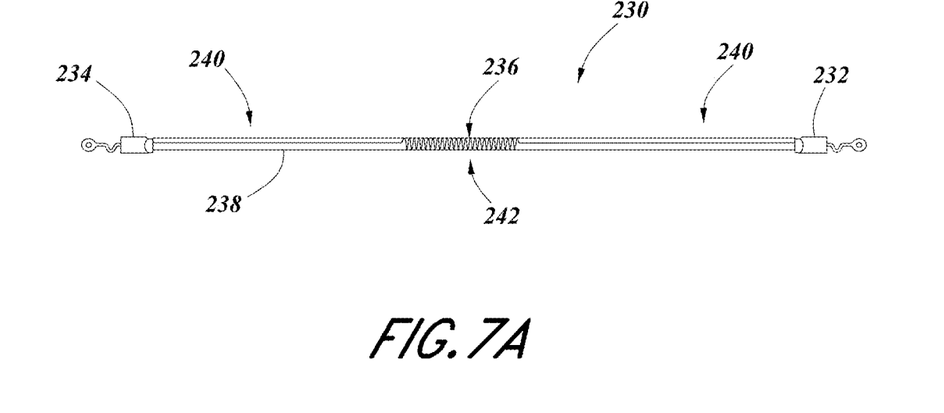
FIG. 7A is a top plan view of an example single linear radiant heat lamp according to some embodiments disclosed herein.
Figure 7B:
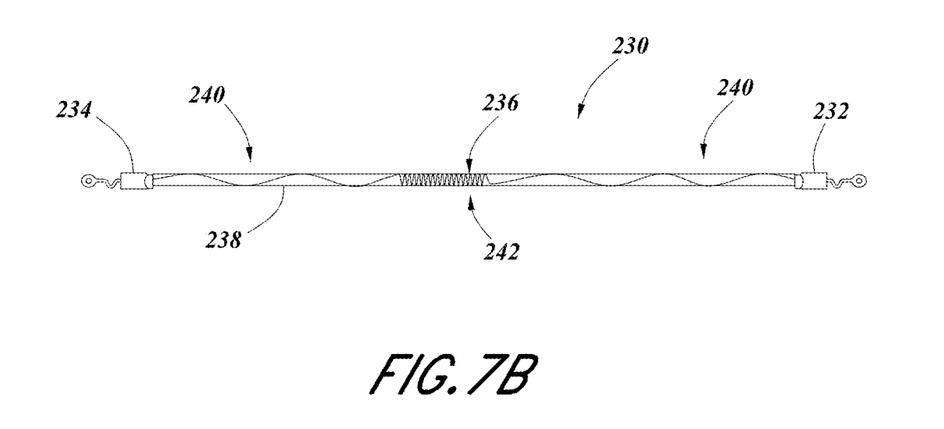
FIG. 7B is a top plan view of another example of a single linear radiant heat lamp according to some embodiments disclosed herein.

With reference to FIGS. 7A and 7B, example lamp constructions according to various embodiments are illustrated therein. In some embodiments, lamp 230 comprises distinct peripheral portions 240 and a central portion 242. In some embodiments, the central portion comprises a relatively higher density of conducting wound filament compared to the peripheral portions, such that the heat output is higher at the center of the lamp relative to the periphery. In some embodiments, such as the embodiment illustrated in FIG. 7A, the peripheral portions 240 may comprise a straight wire extending from the end connectors 232, 234 to the central portion. In those embodiments, the wire may comprise a linear contact with the filament at the point of attachment or junction between the wire in the peripheral portions 240 and the conducting filament in the central portion 242.

Depending on the power rating and distribution of the lamp, the construction of FIG. 7A may result in unsuitably high temperature gradient between the linear filament in the peripheral portions 240 and the wound or coiled filament in the central portion 242. For example, an excessive gradient may compromise the mechanical integrity of the wire, filament or lamp due to baking, melting, or bubbling of the filament, wires, or lamp envelope. Thus, in other embodiments, such as that illustrated in FIG. 7B, both the peripheral portions 240 and the central portion 242 may comprise conducting wound filaments. However, the winding density of the conducting filament in the central portion 242 may be relatively higher than the winding density of the conducting filament in the peripheral portions 240.

In either of the constructions of FIG. 7A or 7B, the central portion 242 of the lamp may comprise a length of about 15 mm to about 30 mm, which may correspond to a cold spot on the substrate to be heated using the lamp. In some embodiments, the central portion 242 of the lamp may comprise a length of about 15 mm. In some embodiments, the central portion 242 of the lamp may comprise a length of about 30 mm. In some embodiments, the central portion 242 of the lamp may comprise a length of about 5 mm, about 5.5 mm, about 6 mm, about 6.5 mm, about 7 mm, about 7.5 mm, about 8 mm, about 8.5 mm, about 9 mm, about 9.5 mm, about 10 mm, about 10.5 mm, about 11 mm, about 11.5 mm, about 12 mm, about 12.5 mm, about 13 mm, about 13.5 mm, about 14 mm, about 14.5 mm, about 15 mm, about 15.5 mm, about 16 mm, about 16.5 mm, about 17 mm, about 17.5 mm, about 18 mm, about 18.5 mm, about 19 mm, about 19.5 mm, about 20 mm, about 20.5 mm, about 21 mm, about 21.5 mm, about 22 mm, about 22.5 mm, about 23 mm, about 23.5 mm, about 24 mm, about 24.5 mm, about 25 mm, about 25.5 mm, about 26 mm, about 26.5 mm, about 27 mm, about 27.5 mm, about 28 mm, about 28.5 mm, about 29 mm, about 29.5 mm, about 30 mm, about 30.5 mm, about 31 mm, about 31.5 mm, about 32 mm, about 32.5 mm, about 33 mm, about 33.5 mm, about 34 mm, about 34.5 mm, about 35 mm, about 35.5 mm, about 36 mm, about 36.5 mm, about 37 mm, about 37.5 mm, about 38 mm, about 38.5 mm, about 39 mm, about 39.5 mm, about 40 mm, about 40.5 mm, about 41 mm, about 41.5 mm, about 42 mm, about 42.5 mm, about 43 mm, about 43.5 mm, about 44 mm, about 44.5 mm, about 45 mm, about 45.5 mm, about 46 mm, about 46.5 mm, about 47 mm, about 47.5 mm, about 48 mm, about 48.5 mm, about 49 mm, about 49.5 mm, about 50 mm, or between any of the aforementioned values. In some embodiments, the length of the central portion and the higher density filament winding therein may be configured to match the diameter of the central portion of the substrate. In some embodiments, a smaller length central portion 242 will provide more targeted heat delivery than a larger length central portion 242.

Locating high-density filament windings at the central portion 242 and wires or lower density filament windings in the peripheral portions 240 of the lamp 230 may result in concentration of the power output of the lamp in the central portion. In some embodiments, for a lamp rated for 4200 W, the central portion may comprise a power output of about 1000 W to about 2000 W. For example, a lamp with a central portion 242 comprising a length of 30 mm may comprise a power output of about 1000 W at the central portion. In another example, a lamp with a central portion 242 comprising a length of 15 mm may comprise a power output of about 2000 W in the central portion. In some embodiments, the power output at the central portion may be about 1000 W, about 1025 W, about 1050 W, about 1075 W, about 1100 W, about 1125 W, about 1150 W, about 1175 W, about 1200 W, about 1225 W, about 1250 W, about 1275 W, about 1300 W, about 1325 W, about 1350 W, about 1375 W, about 1400 W, about 1425 W, about 1450 W, about 1475 W, about 1500 W, about 1525 W, about 1550 W, about 1575 W, about 1600 W, about 1625 W, about 1650 W, about 1675 W, about 1700 W, about 1725 W, about 1750 W, about 1775 W, about 1800 W, about 1825 W, about 1850 W, about 1875 W, about 1900 W, about 1925 W, about 1950 W, about 1975 W, about 2000 W, or between any of the aforementioned values. It will be appreciated by those skilled in the art that the power output at the central portion 242 may vary depending on the power rating of the lamp 238.

Because the length of the central portion 242 is small relative to the total length of lamp 230, the power output density of the central portion 242 may be relatively higher than the power output density in the peripheral portions 240. In some embodiments, the power output density in the central portion 242 may be about 60 W/mm to about 125 W/mm. For example, the power output density in the central portion 242 may be about 60 W/mm, about 62.5 W/mm, about 65 W/mm, about 67.5 W/mm, about 70 W/mm, about 72.5 W/mm, about 75 W/mm, about 77.5 W/mm, about 80 W/mm, about 82.5 W/mm, about 85 W/mm, about 87.5 W/mm, about 90 W/mm, about 92.5 W/mm, about 95 W/mm, about 97.5 W/mm, about 100 W/mm, about 102.5 W/mm, about 105 W/mm, about 107.5 W/mm, about 110 W/mm, about 112.5 W/mm, about 115 W/mm, about 117.5 W/mm, about 120 W/mm, about 122.5 W/mm, about 125 W/mm, or between any of the aforementioned values.

The power output density in the peripheral portions 240 may be relatively lower. In some embodiments, the power output density in the peripheral portions 240 may be about 0 W/mm to about 10 W/mm. For example, the power output density in the peripheral portions 240 may be about 0.00 W/mm, about 0.25 W/mm, about 0.5 W/mm, about 0.75 W/mm, about 1 W/mm, about 1.25 W/mm, about 1.5 W/mm, about 1.75 W/mm, about 2 W/mm, about 2.25 W/mm, about 2.5 W/mm, about 2.75 W/mm, about 3 W/mm, about 3.25 W/mm, about 3.5 W/mm, about 3.75 W/mm, about 4 W/mm, about 4.25 W/mm, about 4.5 W/mm, about 4.75 W/mm, about 5 W/mm, about 5.25 W/mm, about 5.5 W/mm, about 5.75 W/mm, about 6 W/mm, about 6.25 W/mm, about 6.5 W/mm, about 6.75 W/mm, about 7 W/mm, about 7.25 W/mm, about 7.5 W/mm, about 7.75 W/mm, about 8 W/mm, about 8.25 W/mm, about 8.5 W/mm, about 8.75 W/mm, about 9 W/mm, about 9.25 W/mm, about 9.5 W/mm, about 9.75 W/mm, about 10 W/mm, or between any of the aforementioned values.

In some embodiments, the ratio between the power output in the central portion 242 and the power output in the peripheral portions 240 may range from about 5 to about 200. For example, in some embodiments, the ratio between the power output in the central portion 242 and the power output in the peripheral portions 240 may be about 5, about 10, about 15, about 20, about 25, about 30, about 35, about 40, about 45, about 50, about 55, about 60, about 65, about 70, about 75, about 80, about 85, about 90, about 95, about 100, about 105, about 110, about 115, about 120, about 125, about 130, about 135, about 140, about 145, about 150, about 155, about 160, about 165, about 170, about 175, about 180, about 185, about 190, about 195, about 200, or between any of the aforementioned values.

In some embodiments, the ratio between the filament winding density in the central portion 242 and the filament winding density in the peripheral portions 240 may range from about 5 to about 200. For example, in some embodiments, the ratio between the filament winding density in the central portion 242 and the filament winding density in the peripheral portions 240 may be about 5, about 10, about 15, about 20, about 25, about 30, about 35, about 40, about 45, about 50, about 55, about 60, about 65, about 70, about 75, about 80, about 85, about 90, about 95, about 100, about 105, about 110, about 115, about 120, about 125, about 130, about 135, about 140, about 145, about 150, about 155, about 160, about 165, about 170, about 175, about 180, about 185, about 190, about 195, about 200, or between any of the aforementioned values.

Figure 8:
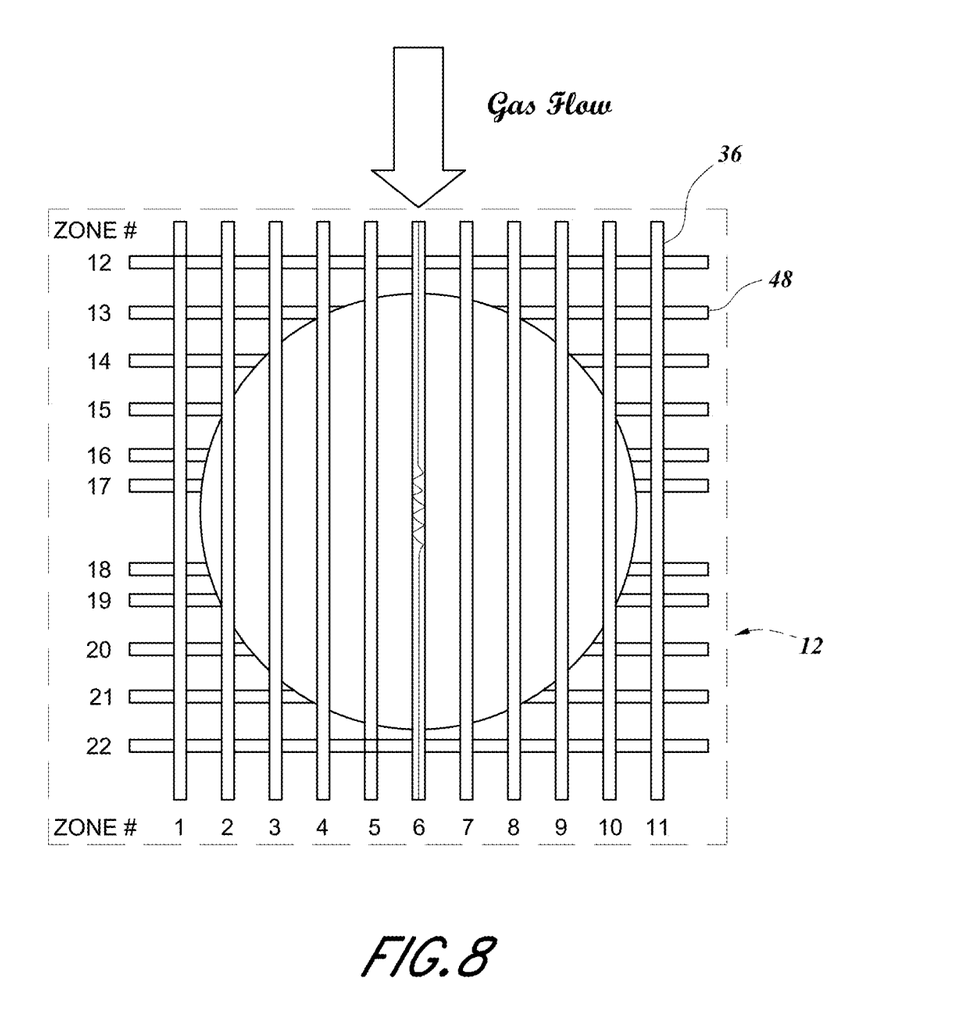
FIG. 8 is a schematic top plan view of a portion of a processing system environment, illustrating an array of radiant heat lamps disposed above and below an example substrate according to some embodiments disclosed herein.

In some embodiments, the lamp constructions of FIGS. 7A and 7B may be used to as one or more lamps of a crossing array, including one or more lamps of the example lamp array illustrated in FIG. 4. For example, in some embodiments, a lamp construction according to FIG. 7A or 7B may replace the lamp located in zone 6 of the top array of lamps 36 of FIG. 4. In some embodiments, only the lamp located in zone 6 of the top array may be replaced. Such a lamp configuration is illustrated in FIG. 8. The remainder of the lamps of the top array of lamps 36 may be similar to one another (e.g., may have a constant filament winding density across a length of those lamps). However, as will be appreciated by one skilled in the art, the lamp constructions of FIGS. 7A and/or 7B may be used to replace any one or more of the lamps of top lamp array 36 or one or more of the lamps of bottom lamp array 38 of FIG. 4. Furthermore, it will be appreciated that the lamp constructions of FIG. 7A or 7B can also be used in alternative lamp configurations, including non-linear arrays, shortened or segmented lamp arrays, or any of the other configurations discussed above. In addition, the lamp constructions may be added as extra or additional lamps to any of the arrays described herein (i.e. without removing any traditional lamps. For example, the lamp constructions may be added adjacent to, above, or beneath any of the lamps illustrated in FIG. 4 to provide additional localized heat control at a specific location of the substrate.

The lamp configuration of FIG. 8 may mitigate or eliminate temperature profile dips located at the center of a semiconductor substrate. The high power output of the central portion of the lamp located in zone 6 may cause a reduction, mitigation, or elimination of a dip in the temperature profile of a semiconductor substrate located between the top and bottom lamp arrays of FIG. 8. For example, with reference again to FIG. 6, use of a lamp according to various embodiments advantageously has been found to provide focused increases in deposited silicon film thickness, with the increase localized in a desired central portion of the substrate, as shown in the top illustrated curve (the curve extending higher at the zero point). The top curve shows a deposition with a lamp construction according to embodiments described herein with a high winding density center portion, while the bottom curve shows a deposition with a lamp construction having conventional windings distributed across the lamp. As shown, the lamp construction according to embodiments described herein effectively increases deposition thickness at the center of the semiconductor substrate, while also decreasing the magnitude of the center dip in thickness.

In the foregoing description, various embodiments been described. It will, however, be evident that various modifications and changes may be made thereto without departing from the broader spirit and scope of the invention. The specification and drawings are, accordingly, to be regarded in an illustrative rather than restrictive sense.

Indeed, it will be appreciated that the systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure.

In addition, while the lamps disclosed herein may advantageously avoid the complicated redesign of reflectors for directing heat emitted by lamps, it will be appreciated that the lamps are nevertheless compatible with such reflectors. Consequently, in some embodiments, the processing system may include lamps with relatively high heat output and winding density in central portions of the lamps, along with reflectors designed to preferentially direct radiant heat from the lamps of the processing system towards central areas of a substrate. For example, the reflectors may be curved to focus radiant heat towards the central areas of the substrate.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

Accordingly, the claims are not intended to be limited to the embodiments described herein, but are to be accorded the widest scope consistent with this disclosure, the principles, and the novel features disclosed herein.

What is claimed is:
1. A semiconductor processing system comprising:
   a reaction chamber comprising:
      a substrate holder configured to support a semiconductor substrate; and
   a top array of linear heat lamps, wherein at least one lamp of the top array of linear heat lamps is configured to provide a power output, the power output varying across a length of the at least one lamp,
   wherein the at least one lamp includes peripheral portions and a central portion between the peripheral portions, wherein the peripheral portions and the central portion each comprise a conducting wound filament, wherein a winding density of the conducting wound filament in the central portion is greater than a winding density of each of the conducting wound filaments in the peripheral portions, wherein the power output is higher within the central portion relative to the power output within the peripheral portions of the at least one lamp, and wherein the at least one lamp of the top array of linear heat lamps comprises a center lamp of the top array of linear heat lamps in which length of the central portion of the at least one lamp is smaller than length of the peripheral portions of the at least one lamp.

2. The semiconductor processing system of claim 1, further comprising a bottom array of linear heat lamps underlying the substrate holder.

3. The semiconductor processing system of claim 1, wherein the length of the central portion is 30 mm.

4. The semiconductor processing system of claim 1, wherein a ratio of the power output of the central portion to the power output of the peripheral portions is between 5:1 and 200:1.

5. The semiconductor processing system of claim 1, further comprising
 a spider configured to support the substrate holder;
 a shaft extending from a lower wall of the reaction chamber, wherein the spider is mounted to the shaft; and
 a central temperature sensor extending through the shaft and the spider, and configured to detect a temperature of the central portion,
 wherein the power output of the at least one lamp is controlled based on the detected temperature of the central portion.

6. The semiconductor processing system of claim 1, wherein each lamp of the top array of linear heat lamps extends substantially parallel to every other lamp of the top array of linear heat lamps.

7. The semiconductor processing system of claim 1, wherein the length of the central portion of the at least one lamp is smaller than the length of each of the peripheral portions of the at least one lamp.

8. The semiconductor processing system of claim 1, wherein the top array of linear heat lamps comprises eleven lamps.

9. The semiconductor processing system of claim 1, wherein the at least one lamp is a sixth lamp from an edge of the top array of linear heat lamps.

10. The semiconductor processing system of claim 1, wherein the reaction chamber further comprises a parabolic reflector.

11. A semiconductor processing system comprising:
 a reaction chamber comprising:
  a substrate holder configured to support a semiconductor substrate; and
 a top array of linear heat lamps, wherein at least one lamp of the top array of linear heat lamps comprises a filament having a varying power output density across a length of the at least one lamp,
 wherein the power output density in a central portion of the at least one lamp is greater than the power output density in peripheral portions of the at least one lamp,
 wherein the filament of the at least one lamp comprises a wound portion in the central portion and a wound portion in each of the peripheral portion, and
 wherein the at least one lamp of the top array of linear heat lamps comprises a center lamp of the top array of linear heat lamps in which length of the central portion of the at least one lamp is smaller than length of the peripheral portions of the at least one lamp.

12. The semiconductor processing system of claim 11, wherein the power output density in the central portion of the at least one lamp is between 60 W/mm and 125 W/mm and the power output density in the peripheral portions of the at least one lamp is between 1 W/mm and 10 W/mm.

13. The semiconductor processing system of claim 11, further comprising a bottom array of linear heat lamps, wherein the substrate holder is located between the bottom array of linear heat lamps and the top array of linear heat lamps.

14. The semiconductor processing system of claim 11, wherein a length of the central portion is between 15 mm and 30 mm.

15. The semiconductor processing system of claim 11, wherein a ratio of the power output density of the filament in the central portion to the power output density of the filament in the peripheral portions is between 5:1 and 200:1.

16. The semiconductor processing system of claim 11, wherein each lamp of the top array of linear heat lamps extends substantially parallel to every other lamp of the top array of linear heat lamps.

17. The semiconductor processing system of claim 11, wherein the length of the central portion of the at least one lamp is smaller than the length of each of the peripheral portions of the at least one lamp.

18. The semiconductor processing system of claim 11, wherein the top array of linear heat lamps comprises eleven lamps.

19. The semiconductor processing system of claim 11, wherein the at least one lamp is a sixth lamp from an edge of the top array of linear heat lamps.

* * * * *